(12) United States Patent
Abbasi et al.

(10) Patent No.: US 6,831,492 B1
(45) Date of Patent: Dec. 14, 2004

(54) COMMON-BIAS AND DIFFERENTIAL STRUCTURE BASED DLL

(75) Inventors: Saeed Abbasi, Wynnewood, PA (US); Fangxing Wei, Bensalem, PA (US)

(73) Assignee: ATI International, Srl, Barbados (KN)

( * ) Notice: Subject to any disclaimer, the term of this patent is extended or adjusted under 35 U.S.C. 154(b) by 272 days.

(21) Appl. No.: 09/655,552

(22) Filed: Sep. 6, 2000

(51) Int. Cl.[7] .............................................. H03L 7/06
(52) U.S. Cl. ...................................... 327/158; 327/161
(58) Field of Search ............................... 327/149, 158, 327/153, 161, 270, 271, 274, 276, 277, 280, 284, 287, 147, 156, 311, 312

(56) References Cited

U.S. PATENT DOCUMENTS

| 5,600,284 A | * | 2/1997 | Nguyen et al. ......... 331/177 R |
| 5,727,037 A | * | 3/1998 | Maneatis .................... 375/374 |
| 6,094,103 A | * | 7/2000 | Jeong et al. .................. 331/57 |

OTHER PUBLICATIONS

Johns et al., "Analog Integrated Circuit Design", 1997, Canada, Chapter 16, pp. 675–679.

Maneatis, John G., "Low–Jitter Process–Independent DLL and PLL Based on Self–Biased Techniques", IEEE Journal of Solid State Circuits, vol. 31, No. 11, pp. 1723–1732, Nov. 1996.
Baker et al., "CMOS Circuit Design, Layout, and Simulation", 1998, Chapter 19, pp. 417–423.

* cited by examiner

Primary Examiner—Timothy P. Callahan
Assistant Examiner—Cassandra Cox
(74) Attorney, Agent, or Firm—Volpe and Koenig, P.C.

(57) ABSTRACT

A delay-locked loop for outputting a precisely signal relative to an input reference signal includes a plurality of selectively controlled delay elements and a delay element control circuit, including a phase detector for detecting a phase shift between the input reference signal and the delayed output signal and producing an error signal. Each of the delay elements includes a first input associated with a negative output and a second input associated with a positive output, whereby the positive and negative outputs are selectively coupled to a constant voltage source responsive to a first bias voltage and to a ground. The positive and negative outputs are responsive to a second bias voltage and the first and second voltage inputs. The constant voltage source and the positive output are coupled via a first transistor and the constant voltage source and negative output are coupled via being a second transistor.

7 Claims, 3 Drawing Sheets

COMMON-BIAS AND DIFFERENTIAL STRUCTURE BASED DLL

BACKGROUND

The present invention relates generally to delay-locked loop (DLL) circuits. More particularly, this invention relates to a DLL circuit which utilizes a single common-bias generator to supply the bias voltages and current for a plurality of delay cells.

Delay-locked loops are often used in the I/O interfaces of digital integrated circuits in order to hide clock distribution delays and to improve overall system timing. The maintenance of the timing throughout a circuit is important. Timing becomes even more critical in applications requiring high-speed processing of information, such as with video processors. An example of its importance is recognized in a memory read/write circuit. The synchronization of the signal which opens the memory cell with the signal carrying the information to be read from memory or written to memory must be achieved with a certain tolerance. If these two signals are not in sync, the information to be read or written may be lost or corrupted.

The timing throughout a circuit deviates from the system clock when noise is introduced by various system components and capacitive effects due to system interconnections. In recent years, the demand has risen for devices requiring high-speed processing. As a result, the demand for DLL circuits that quickly compensate for electronic noise and capacitive delays has also risen. The problem is that the amount of phase shift produced as a result of the supply, substrate noise and capacitor load is directly related to how quickly the DLL can correct the output frequency.

A design used by those skilled in the art to eliminate the noise present in the circuit at the required speed utilizes a self-bias signal technique. Referring to FIG. 1A, this prior art DLL circuit is a self-biasing configuration which uses a differential buffer delay cell, containing a source coupled pair with resistive loads elements called symmetric loads which causes a nonlinear delay with respect to a low pass output voltage shown in FIG. 1B. The resistance of these symmetric loads is adjusted by the bias circuit to obtain a certain voltage level across them. Therefore, this configuration requires that a symmetric load be used for each separate delay cell present in the DLL circuit.

The problem with this is that it requires the control of a plurality of symmetric loads, which makes the circuit more complicated and more difficult to control. Another problem with the use of a plurality of symmetric loads is that they require the use of more space. Since the cost of a silicon chip is largely dependent upon the number of components on a chip which affects the size of the chip, a larger chip leads to higher costs for the chip.

Accordingly, there exists a need for a DLL circuit which is easier to control, requires less space and produces less electronic noise.

SUMMARY

The present invention comprises a DLL having a plurality of delay elements and a common bias generator. The DLL includes a phase detector for detecting a phase shift between a reference frequency and an output frequency and produces an error signal. A low pass filter filters the error signal, which is input to the common-bias generator. The bias generator generates a common bias voltage pair to selectively control the plurality of delay elements.

BRIEF DESCRIPTION OF THE DRAWING(S)

DETAILED DESCRIPTION OF THE PREFERRED EMBODIMENT(S)

Figure 1A:
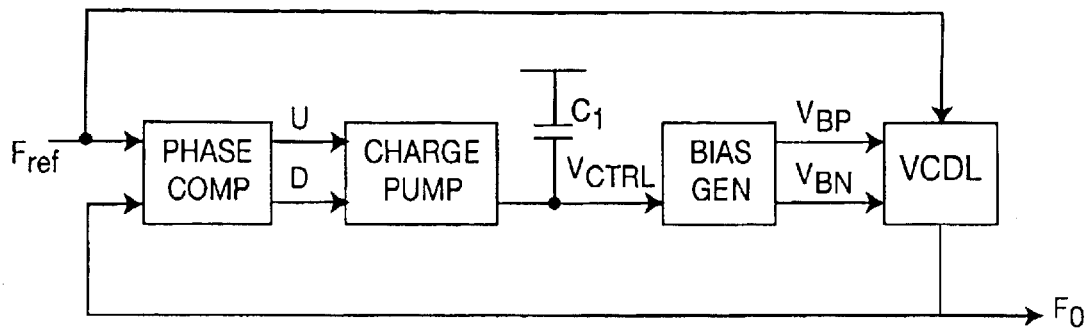
FIG. 1A is a prior art DLL.
Figure 1B:
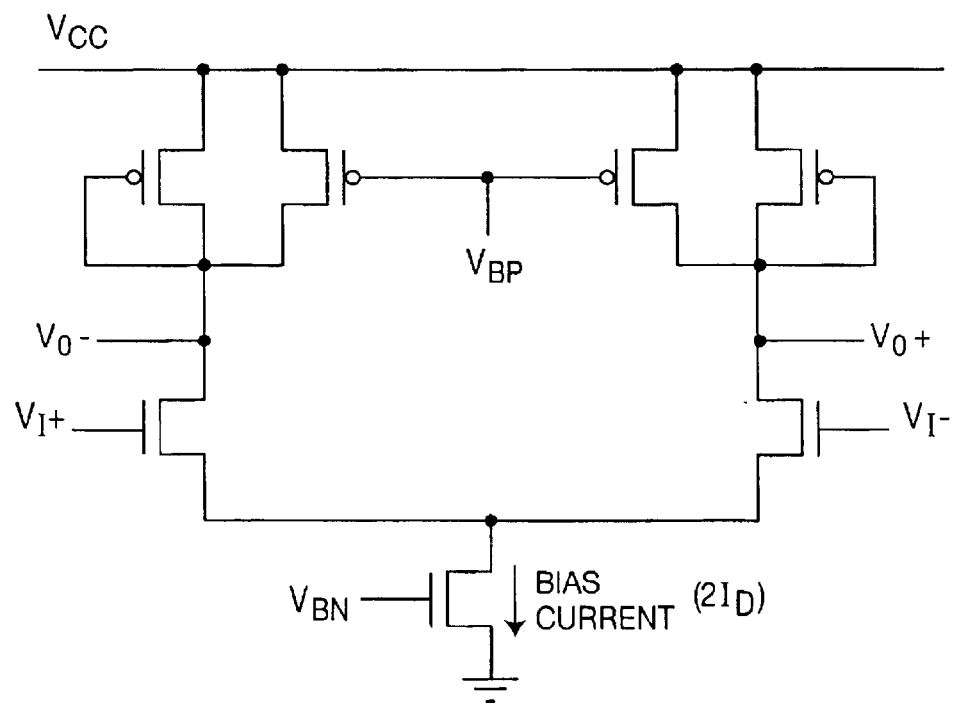
FIG. 1B is a prior art differential buffer delay cell.

The first embodiment of the present invention will be described with reference to the drawing figures wherein like numerals represent like elements throughout.

Figure 2:
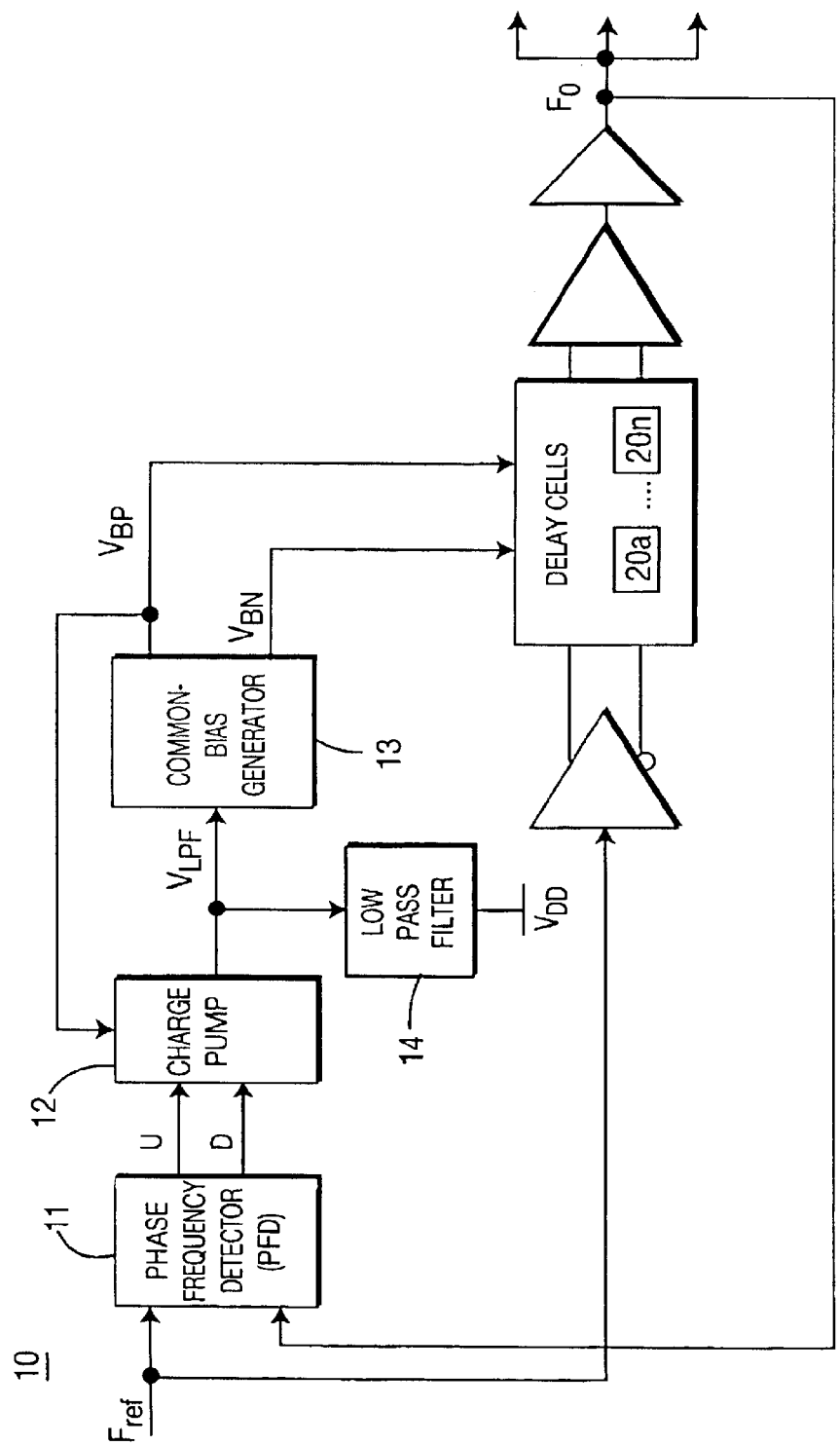
FIG. 2 is a block diagram of a DLL circuit in accordance with the present invention.

Referring to FIG. 2, a DLL circuit made in accordance with the present invention is shown. The DLL circuit 10 includes a phase frequency detector (PFD) 11, a charge pump 12, a low pass filter 14, a single common-bias generator 13, and a plurality of delay cells $20_a \ldots 20_n$. The DLL circuit 10 utilizes two input signals: 1) a reference frequency $F_{ref}$; and 2) a signal $F_0$ output from the delay cells $20_a \ldots 20_n$. The DLL circuit accepts these input signals $F_0$, $F_{ref}$ and uses them to determine the amount of delay necessary to compensate for any noise/phase shift that is present. The comparison of the input signals $F_0$ and $F_{ref}$ is accomplished in the PFD 11. As those skilled in the art should know, the PFD 11 determines the phase difference between the reference frequency $F_{ref}$ and the delay cell output signal $F_0$. The phase difference are two "phase error" signals U, D. If the PFD detects a difference between the two input signals $F_0$, $F_{ref}$, the phase error signals U, D are output to the charge pump 12 to charge or discharge a capacitor $C_1$ (not shown) within the low pass filter 14. The duration of these output signals U, D depend on the amount of phase error that is detected by the PFD 11. The higher the error, the longer the duration of the signal to charge or discharge the capacitor $C_1$, in the low pass filter 14.

The charge pump 12 uses the phase error signals to adjust the delay through the delay cells $20_a$–$20_n$. The charge pump 12 receives the error signals U, D as well as a voltage input $V_{BP}$ from the common-bias generator 13 and adjusts the voltage on the low pass filter 14. It should be well known to those skilled in the art that the charge pump 12 charges and discharges the capacitor $C_1$, in the low pass filter 14 which creates a voltage change across the low pass filter 14. The low pass filter output signal $V_{LPF}$ resulting from the charging and discharging of the capacitor $C_1$ in the low pass filter 14 is detected by the common-bias generator 13.

As a result of this voltage change on $V_{LPF}$, the common-bias generator 13 pushes the bias current it generates up or down. The common-bias generator 13 produces the bias voltages $V_{BN}$ and $V_{BP}$ for all of the delay cells $20_a$–$20_n$. As it is well known to those skilled in the art, the primary function of the common-bias generator 13 is to continuously adjust the buffer bias current in the delay elements which either increases or decreases the delay created by the delay cells $20_a$–$20_n$. The voltages $V_{BP}$ and $V_{BN}$, established by the common-bias generator 13, are then utilized by the delay cells $20_a \ldots 20_n$, as will be described hereinafter.

Figure 3:
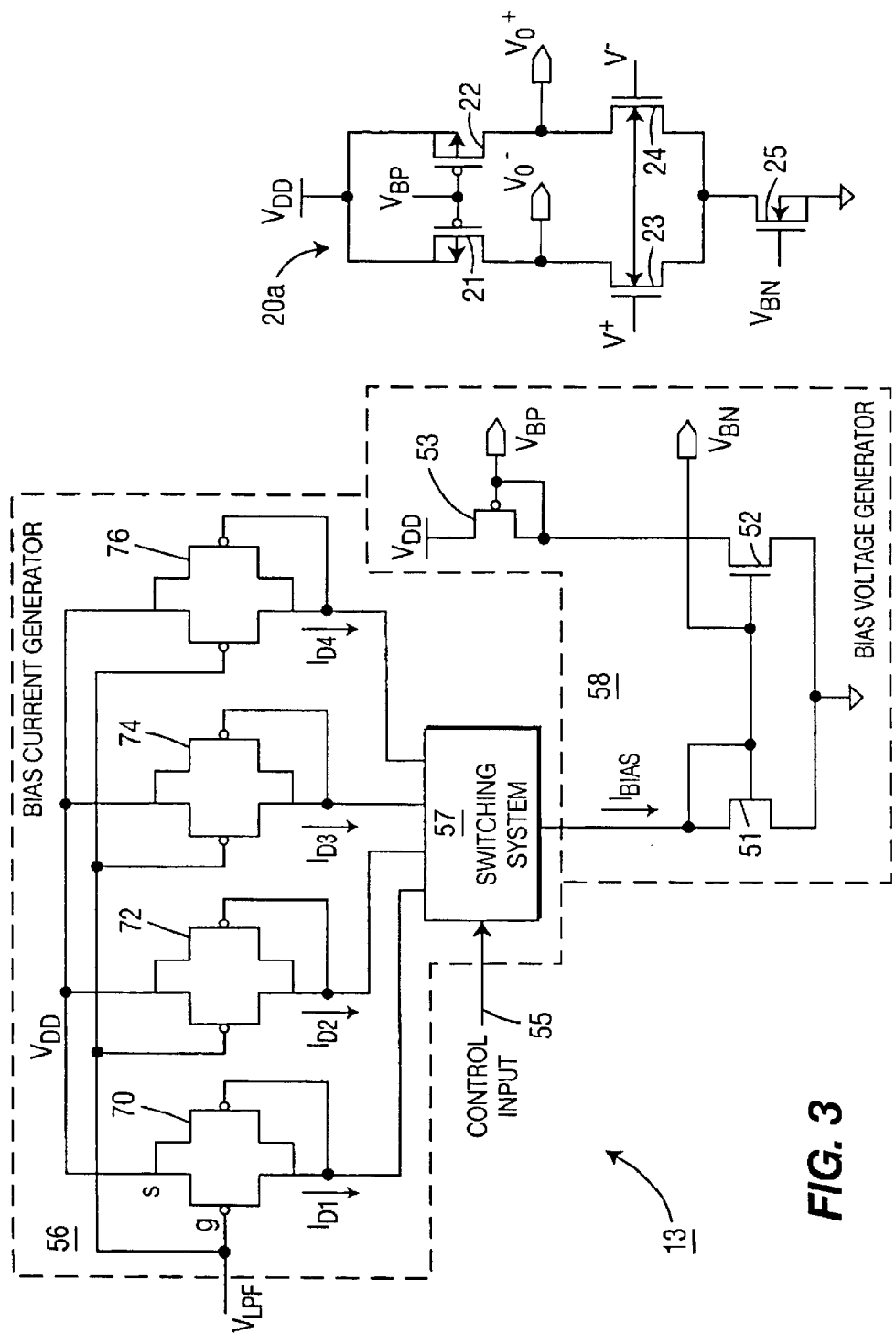
FIG. 3 is a diagram of the bias generator and a single delay cell in accordance with the present invention.

Referring to FIG. 3, the preferred embodiment of the present invention utilizes a single common-bias generator 13 comprising a bias current generator 56 and a bias voltage generator 58. The bias current generator 56 consists of four symmetric loads 70, 72, 74, 76 each of which has as its source voltage $V_{DD}$ and the low pass filter output signal $V_{LPF}$ as its gate voltage. The four symmetric loads 70, 72, 74, 76 act as current sources $I_{D1}$, $I_{D2}$, $I_{D3}$, $I_{D4}$, which are combined to establish the appropriate bias current $I_{Bias}$. This combination is accomplished through the switching system 57, which combines the currents according to the required bias. For example, if a minimum bias current $I_{Bias}$ is required, the switching system 57 provides the current from only a single symmetric load 70, 72, 74 or 76 (for example, $I_{D1}$ from symmetric load 70). If a higher bias current $I_{Bias}$ is required, the switching system 57 switches on an additional current source (for example, current $I_{D2}$ from symmetric load 72) along with current $I_{D1}$. In this manner, the switching system 57 provides four discrete levels of bias current $I_{Bias}$ to control the delay cells $20_a$–$20_n$, which allows for better control of the DLL circuit by allowing the varying of the current slope without having to vary the delay cell. As a result of the switching system 57, a bias current $I_{Bias}$ is produced.

The switching system 57 accepts a control input 55 from a control circuit (not shown) to determine the amount of bias current $I_{Bias}$ to be supplied to the delay cells $20_a$–$20_n$. The control circuit determines the number of current sources $I_{D1}$, $I_{D2}$, $I_{D3}$, $I_{D4}$ depending upon the current range that is required. For example, a current range of 0–40 µA will require the first current source $I_{D1}$; whereas a current range of 0–60 µA will require the first two current sources $I_{D1}$, and $I_{D2}$. The process for selecting the current range is not pertinent to the present invention. Once the desired current range is input into the control circuit, the control circuit determines the number of required current sources $I_{D1}$, $I_{D2}$, $I_{D3}$, $I_{D4}$ to support the current range. A control signal is sent through the control input 55 to the switching system 57 to switch in the appropriate number of current sources $I_{D1}$, $I_{D2}$, $I_{D3}$, $I_{D4}$.

The bias current $I_{Bias}$ is output from the switching system 57 to the bias voltage generator 58. The bias voltage generator 58 comprises two n-channel transistors 51, 52, and one p-channel transistor 53. The n-channel transistors 51, 52 are configured in such a way that the bias current through transistor 51 is mirrored onto transistor 52 and reflected up to transistor 53. When the bias current $I_{Bias}$ is mirrored in this way, two reference voltages are created. The two reference voltages are the bias voltages, $V_{BN}$ and $V_{BP}$, which are used by each delay cell $20_a$ . . . $20_n$. The two bias voltages $V_{BN}$, $V_{BP}$ determine the amount of delay for each delay cell within the DLL circuit 10. This configuration also provides the bias current $I_{Bias}$ from the common-bias generator 13 to each delay cell $20_a$ . . . $20_n$. Using this current source switch and a selectable number of delay cells, provides better linearity in the delay. It also provides an advance bandwidth tracking system while the current source switch is set for best linearity performance, which leads to lower jitter at the output.

The DLL circuit 10 utilizes a plurality of delay cells $20_a$ . . . $20_n$ to maintain overall system timing. In accordance with the preferred embodiment of the present invention, each delay cell $20_a$ . . . $20_n$ contains two P-channel transistors 21 and 22 and three N-channel transistors 23, 24, 25. Transistors 23, 24 act as switches in the delay cell $20_a$ and determine the actual delay for each cell based on the bias current $I_{Bias}$. The P-channel transistors 21, 22 act as current sources for the transistors 23, 24. Transistor 25 acts as a current source as well.

The P-channel transistors 21, 22 are biased by the voltage $V_{BP}$. Since the amount of bias current determines the voltage of $V_{BP}$, the buffer delay time changes with $V_{BP}$. Transistors 23 and 24 receive a voltage input $V^+$, and $V^-$. When transistor 24 is "off" (or not conducting), there is no current provided through it by transistor 22. Likewise, when transistor 23 is not conducting, there is no current provided through it by transistor 21.

There are parasitic capacitances at the inputs of transistors 23 and 24 that charge and discharge to generate the voltages $V^+$ and $V^-$, which rise and fall. When the transistors 23 and 24 are on and off, respectively, the capacitances at the input of transistors 23 and 24 on the following delay cell will be affected. When transistor 23 is turned on, it discharges the parasitic capacitance of the following delay cell and $V_O^-$ changes from $V_{DD}$ to 0V. Likewise, when transistor 24 is off, the capacitance of the following delay cell is charged from 0V to $V_{DD}$, which is $V_{DS}$ of transistor 22 at saturation. As is well known by those skilled in the art, the delay provided by the delay cell is equivalent to the duration between turning on transistor 23 and turning off transistor 24, and when the voltages $V^+$ and $V^-$ are equal. When this point is reached, the transistors in the next delay cell are activated. The $V_O^+$ and the $V_O^-$ are the output voltages of each delay cell and provide the input voltages $V^+$, $V^-$ to the next delay cell.

The delay cell configuration as well as the bias generator configuration provides the required bias voltages $V_{BN}$ and $V_{BP}$ to all delay cells within the DLL circuit 10.

The advantage of this circuit design is that it reduces, from prior art methods, the number of transistors required for the DLL circuit 10 by two for each delay cell $20_a$ . . . $20_n$, plus any additional symmetric load transistors used for the configuration of the charge pump 12. This reduction in transistors results in the reduction of costs, reduction of semiconductor space required and the reduction of noise due to the additional circuit components.

While a specific embodiment of the present invention has been shown and described, many modifications and variations could be made by one skilled in the art without departing from the spirit and scope of the invention. The above description serves to illustrate and not limit the particular form in any way.

What is claimed is:

1. A delay-locked loop (DLL) for outputting a precisely delayed signal relative to an input reference signal, comprising:

a plurality of selectively controlled delay elements, each of said delay elements including:

a first input associated with a negative output, a second input associated with a positive output, said positive and negative outputs selectively coupled to a constant voltage source responsive to a first bias voltage, said positive and negative outputs also selectively coupled to a ground and being responsive to a second bias voltage and said first and second voltage inputs, said selective coupling to ground being a third and fourth single transistor respectively, said selective coupling of said constant voltage source and said positive output being a first single transistor, and said selective coupling of said constant voltage source and said negative output being a second single transistor; and a delay element control circuit, for generating said first and second bias voltages, including a phase detector for detecting a phase shift between the input reference signal and the delayed output signal and producing an error signal.

2. The DLL of claim 1 further including:

a low-pass filter for filtering said error signal;

a charge pump, responsive to said error signal, wherein said charge pump charges and discharges said low-pass filter; and a common bias generator for receiving said filtered error signal and generating a common bias current, whereby said first and second bias voltages determine the amount of delay provided by said plurality of delay elements.

3. The DLL of claim 2, whereby said common bias generator includes a bias current generator including a plurality of current sources coupled to a switching circuit; said switching circuit for selectively switching said plurality of current sources to provide said common bias current.

4. The DLL of claim 3, whereby said common bias generator further includes a bias voltage generator, for receiving said common bias current and generating said first and second bias voltages.

5. The DLL of claim 3, whereby each of said current sources includes a symmetric load for generating an output current, which is input into said switching circuit; and whereby said switching circuit receives each of said output currents.

6. The DLL of claim 1 whereby said plurality of selectively controlled delay elements are connected in series; the outputs of one delay element being coupled to the inputs of the next delay element.

7. A common bias generator, for use in a delay-locked loop (DLL) which outputs a precisely delayed signal relative to an input reference signal; the DLL including a plurality of selectively controlled delay elements, a delay element control circuit including a phase detector for detecting a phase shift between said input reference signal and said delayed output signal and producing an error signal, a low-pass filter for filtering said error signal, and a charge pump, responsive to said error signal, for charging and discharging said low-pass filter; whereby said common bias generator includes:

a bias current generator, including:

a plurality of current sources; and a switching circuit, coupled to said plurality of current sources for selectively switching said plurality of current sources to output a common $I_{bias}$ current; whereby said common bias generator receives said filtered error signal and generates said common bias current to control the amount of delay provided by said plurality of delay elements.

* * * * *